United States Patent [19]

Uno

[11] Patent Number: 4,594,688
[45] Date of Patent: Jun. 10, 1986

[54] POWER SUPPLY CIRCUIT FOR FLIP-FLOP MEMORY

[75] Inventor: Takashi Uno, Tokyo, Japan

[73] Assignee: Nippon Electric Co., Ltd., Tokyo, Japan

[21] Appl. No.: 416,765

[22] Filed: Sep. 10, 1982

[30] Foreign Application Priority Data

Sep. 10, 1981 [JP] Japan .................... 56-142741

[51] Int. Cl.⁴ .................................. G11C 11/40
[52] U.S. Cl. ........................ 365/95; 365/154; 365/228
[58] Field of Search ............... 365/95, 226, 228, 154, 365/204, 218; 307/238.3

[56] References Cited

U.S. PATENT DOCUMENTS 3,753,011 8/1973 Faggin ..................... 307/238.3
4,366,560 12/1982 McDermott et al. .......... 365/95

FOREIGN PATENT DOCUMENTS 0152593 9/1982 Japan ...................... 365/226
1311342 3/1973 United Kingdom .

Primary Examiner—James W. Moffitt
Attorney, Agent, or Firm—Sughrue, Mion, Zinn, Macpeak, and Seas

[57] ABSTRACT

A memory device is disclosed which is automatically and stably set to a predetermined logic state upon the application of power thereto. The memory device comprises a flip-flop having first and second cross-connection points, a state setting transistor coupled between the second cross-connection point and a reference voltage terminal, a voltage detection circuit for detecting the value of a power supply voltage, and a reset circuit responsive to an output signal of the detection circuit for controlling the state setting transistor.

18 Claims, 4 Drawing Figures

POWER SUPPLY CIRCUIT FOR FLIP-FLOP MEMORY

BACKGROUND OF THE INVENTION

The present invention relates to a memory circuit, and more particularly to a memory circuit which can assume a predetermined memory state when the application of power is initiated by a power switch.

In a data processor such as an electronic computer or a microcomputer, a large number of memory devices are used, and among these memory devices some must be set to a predetermined memory state such as a reset state prior to the operation of the data processor. To that end, bistable memory circuits which can be automatically reset upon the switching on of a power supply have been used in large numbers. These memory circuits are generally called power-on-reset type memory circuits. In such a power-on-reset type memory circuit, a flip-flop circuit is used as a memory section and a difference is produced between the potential rises at a pair of cross-connection points in the flip-flop circuit which are caused by a power supply voltage upon switching on the power supply. This is done by making the electrical characteristics of a pair of load circuits in the flip-flop circuit unbalanced, to thereby automatically and simultaneously set the cross-connection point connected to the load circuit having the larger current feed capability at logic "1" and the cross-connection point connected to the load circuit having the smaller current feed capability at logic "0". Thus, the above-mentioned reset operation can be achieved.

However, in the event that the known power-on-reset type memory circuit is in the set state when the power supply is switched off and after a relatively short period of time is again switched on, the memory circuit cannot be automatically set to the reset state. Consequently, an information processor making use of such memory devices had a shortcoming that a malfunction would be caused thereby. More particularly, that one of the pair of cross-connection points in the flip-flop which is held at the power supply level in the set state would not immediately be brought to the ground level even if the power supply were switched off, but would be discharged gradually towards the ground level. Accordingly, if the power supply were switched on during this discharging process, then the flip-flop would not assume the reset state but would be set to the set state.

As described above, the power-on-reset type memory device of the prior art had a in that if the time interval between the switching-off and switching-on of the power supply were short, the power-on-reset function could not operate reliably.

SUMMARY OF THE INVENTION

It is therefore one object of the present invention to provide a memory device which can be reliably set to a desired memory state in response to the switching-on of a power supply.

According to one feature of the present invention, there is provided a memory device comprising a flip-flop having first and second cross-connection points, a state setting transistor connected between the second cross-connection point and a reference potential point, a power supply terminal, means for generating a control voltage having a larger value than a threshold value of the state setting transistor when the voltage at the power supply terminal is at an intermediate voltage that is larger than the reference potential and smaller than a voltage defined as a power supply voltage, and means for applying the control voltage to the gate of the state setting transistor.

According to the present invention, owing to the fact that the above-mentioned state setting transistor becomes conducting when the voltage of the power supply rises, the second cross-connection point of the flip-flop can be forcibly set to the ground level regardless of whether or not a charge is present at the second cross-connection point.

In the memory device according to the present invention, it is desirable to select a current feeding capability of a first load connected to the first cross-connection point in the flip-flop to a value larger than a current feeding capability of a second load connected to the second cross-connection point. For this purpose, the first load may be formed with a transistor having a larger mutual conductance value than that of a transistor forming the second load. Similarly, the first load may be formed with a transistor having a smaller threshold value than that of a transistor forming the second load.

By making such provisions, it becomes possible to hold the second cross-connection point at the reference potential by means of the state setting transistor and also to reliably charge the first cross-connection point up to the power supply voltage level through the first load.

According to another aspect of the present invention, there is provided a memory device comprising first and second nodes, a power supply terminal, a reference potential terminal, first and second field effect transistors having their gates and drains cross-connected at the first and second nodes, respectively, a third field effect transistor of the depletion type having its gate and source connected to the first node and its drain connected to the power supply terminal, a fourth field effect transistor having its source connected to the second node and its drain and gate connected to the power supply terminal, a fifth field effect transistor connected between the second node and the reference potential terminal, a third node, a sixth field effect transistor of the depletion type connected between the power supply terminal and the third node and having its gate connected to its own source, and a seventh field effect transistor connected between the third node and the reference potential terminal and having its gate connected to the power supply terminal.

The above-mentioned and other objects, features and advantages of the present invention will become more apparent by reference to the following description of a preferred embodiment of the invention taken in conjunction with the accompanying drawings,

DETAILED DESCRIPTION OF THE INVENTION

Now the present invention will be described in greater detail with reference to the accompanying drawings. In the following description, it is assumed that N-channel field effect transistors are employed, and positive logic in which a high level represents logic "1", while a low level represents logic "0", is employed. It is to be noted that the field effect transistors are, except for those specifically noted, of the enhancement type.

Figure 1:
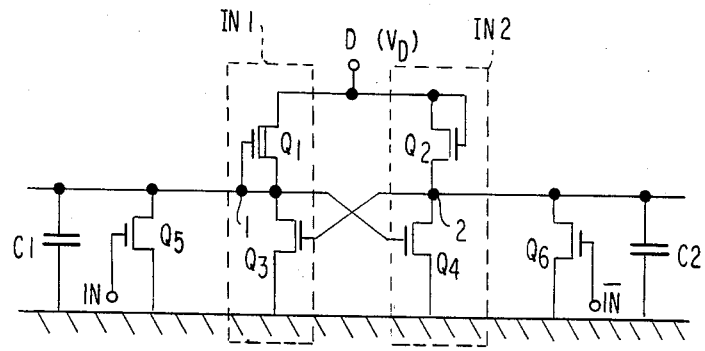
FIG. 1 is a circuit diagram showing a memory device of the prior art.

First, a description will be made of a power-on-reset type memory device of the prior art, with reference to FIG. 1. In this figure, a first inverter $IN_1$ and a second inverter $IN_2$ have their inputs and outputs cross-connected at nodes 1 and 2 as input/output points to form a flip-flop. In the first inverter $IN_1$, a depletion type load transistor $Q_1$ has a drain connected to a power supply terminal D, and a gate and source commonly connected to the node 1. An enhancement type load transistor $Q_2$ in the second inverter $IN_2$ has its drain and gate connected to the power supply terminal D and its source connected to the other output point 2. In addition, amplifier transistors $Q_3$ and $Q_4$ are connected, respectively, in the illustrated manner, and as a whole the circuit arrangement is constructed so that positive feedback may be established between the input/output points 1 and 2 of the two inverters $IN_1$ and $IN_2$. In addition, between the input/output points 1 and 2 and the ground are present parasitic capacitances $C_1$ and $C_2$, respectively, which consist of stray capacitances such as wiring capacitances and MOS capacitances. Furthermore, between the input/output points 1 and 2 and the ground are respectively connected writing transistors $Q_5$ and $Q_6$ receiving true and complementary input data IN and $\overline{IN}$ at their gates.

In the case where the voltage at the power supply terminal D is equal to the ground potential, every node is at the ground potential under an equilibrium condition, and hence at the moment when the switching on of the power supply is initiated, both the transistors $Q_3$ and $Q_4$ are held off. (It is assumed that the transistors $Q_5$ and $Q_6$ are also held off.) Consequently, the input/output points 1 and 2 are charged according to the time constants $R_1C_1$ and $R_2C_2$, respectively, which are determined by the on-resistances $R_1$ and $R_2$ of the transistors $Q_1$ and $Q_2$ upon conducting, respectively, and the parasitic capacitances $Q_1$ and $Q_2$, until either one of the output points 1 and 2 reaches a threshold voltage $V_{T1}$ of the transistor $Q_4$ or $Q_3$. Assuming that the circuit is designed so as to fullfill the relationship $R_1C_1 < < R_2C_2$, then the input/output point 1 would first reach the threshold voltage $V_{T1}$, and hence, the transistor $Q_4$ begins to turn on. Since the on-resistance of the load transistor is large, the potential rise at the input/output point 2 is suppressed to a small value. On the other hand, since the transistor $Q_3$ is held off, the input/output point 1 is further charged, and consequently acts to further lower the on-resistance of the transistor $Q_4$ and to lower the potential at the output point 2. As described above, in the circuit designed so as to fullfill the relationship $R_1C_1 < < R_2C_2$, when the switching on of a power supply is initiated under an equilibrium condition, the input/output point would always be pulled up to the power supply voltage, which is a desired initial set state.

The above-described operation is for the case where the rise in potential of the power supply voltage is sufficiently fast as compared to the time constant $R_1C_1$. If the rise of the power supply is considerably slow as compared to the time constant $R_1C_1$, the memory circuit operates in the following manner. In the case where the switching on of the power supply is initiated under an equilibrium condition, the input/output point 1 would rise while being maintained at the same potential as the power supply voltage owing to the depletion type load transistor $Q_1$, but the input/output point 2 would not rise in potential until the power supply voltage reaches the threshold voltage $V_{TQ2}$ of the load transistor $Q_2$. More particularly, so long as the above-mentioned amplifier transistors $Q_3$ and $Q_4$ are held off, the input/output point 1 assumes the power supply voltage $V_D$, and the input/output point 2 assumes the voltage $(V_D - V_{TQ2})$. At the power supply voltage $V_D = V_{T1}$, the transistor $Q_4$ begins to turn on. However, at this moment since the transistor $Q_3$ is kept off, the input/output point 1 further rises in potential following the rise of the power supply voltage. On the other hand, the input/output point 2 begins to fall in potential. As described above, the input/output point 1 is pulled up to the power supply voltage, which is the desired initial set state, regardless of the rising speed of the power supply voltage in potential.

Now, if the input/output point 1 is lowered in potential to the ground potential by turning on the above-mentioned writing transistor $Q_5$ after the above-mentioned initial set state has been established, then the output point 2 is charged through the load transistor $Q_2$ and takes a high level of $(V_D - V_{TQ2})$. If this particular level $(V_D - V_{TQ2})$ is higher than a logic threshold value of the first inverter $IN_1$, then this stage (a second stable state) can be maintained even after the writing transistor $Q_5$ becomes turned off. In the event that the power supply voltage is turned off after the above-mentioned second stable state has been established, since the transistors $Q_2$ and $Q_4$ are held off, the potential at the input/output point 2 can be held. The holding time is determined by a leakage current $I_L$ and the node capacitance $C_1$, and as the leakage current $I_L$ is normally very small, that is, as a leakage resistance $R_L$ is normally very high, there is a fear that the holding time may become considerably long. Accordingly, if the power supply voltage should be turned on again during the above-mentioned holding time, the circuit would be maintained at the second stable state. Thus, the desired initial set state could not be established. As described above, the known memory device of the prior art had the shortcoming that if the time interval between switching-off and switching-on of the power supply were short, the desired power-on-reset function could not be achieved.

Figure 2:
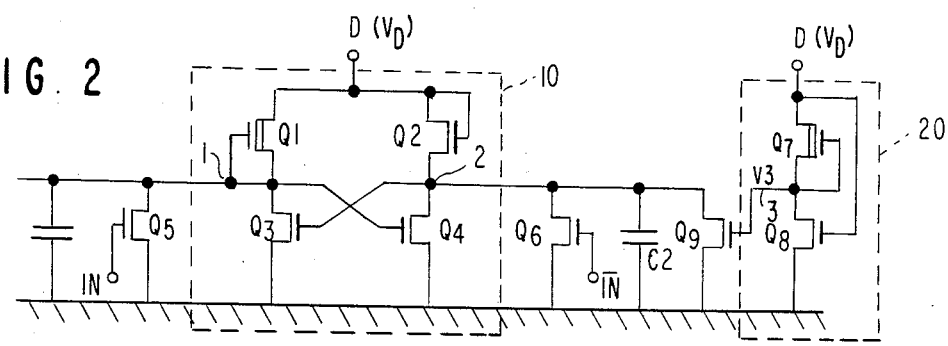
FIG. 2 is a circuit diagram showing a memory device according to one preferred embodiment of the present invention.

Now, one preferred embodiment of the present invention will be described with reference to FIG. 2. In this figure, a flip-flop section 10 is composed of transistors $Q_3$ and $Q_4$ having their gates and drains cross-connected at nodes 1 and 2, respectively, a depletion type transistor $Q_1$ having its gate and source connected to the node 1 and serving as a load, and a transistor $Q_2$ having its gate and drain connected in common and serving as a load. A transistor $Q_5$ connected between the node 1 and the ground has a first write signal IN applied to its gate to set the flip-flop 10 to a set state, that is, to the state where the node 1 is held at a low level and the node 2 is held at a high level. A transistor $Q_6$ connected between the node 2 and the ground has a second write signal $\overline{IN}$ applied to its gate to set the flip-flop 10 to a reset state, that is, to the state where the node 1 is held at a high level and the node 2 is held at a low level. A transistor $Q_9$ connected between the node 2 and the ground is a state setting transistor provided according to the present invention, and this transistor is controlled by an output of a power supply voltage detection circuit 20 consisting of a series circuit of a depletion type transistor $Q_7$ and a transistor $Q_8$. In the illustrated embodiment, the threshold voltages of the enhancement type transistors $Q_2$ to $Q_6$, $Q_8$ and $Q_9$ are 0.6 to 0.9 V, while the depletion type transistors $Q_1$ and $Q_7$ have threshold voltages of 0 to −1 V. In the power supply voltage detection circuit 20, the depletion type transistor $Q_7$ has its drain connected to a power supply terminal D and its gate and source connected to a detection output point 3. The enhancement type transistor $Q_8$ has its drain, gate and source connected to the detection output point 3, the power supply terminal D and the ground, respectively, as shown in FIG. 2. These transistors $Q_7$ and $Q_8$ jointly form the power supply voltage detection circuit 20.

Figure 3:
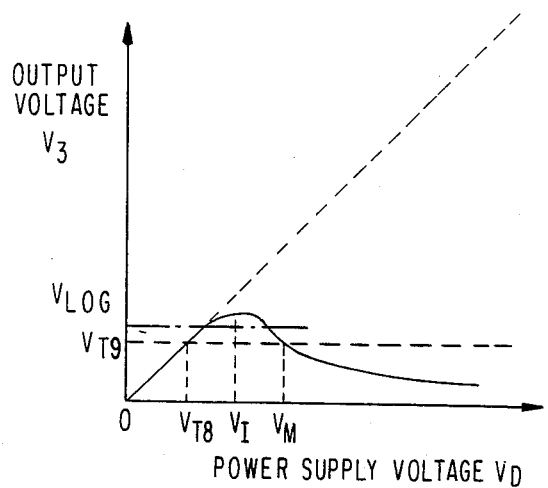
FIG. 3 is a diagram showing an output characteristic of a power supply voltage detection circuit to be used in the memory device according to the present invention.

Referring to FIG. 3, the relationship between the output voltage $V_3$ at the output point 3 of the circuit 20 and the power supply voltage $V_D$ will be described. The transistor $Q_8$ is held in the nonconductive state when the power voltage $V_D$ assumes a value between O and the threshold voltage $V_{T8}$ of transistor $Q_8$. On the other hand, the transistor $Q_7$ is a depletion transistor, and hence a conductive path is formed between the power terminal D and the output point 3. Accordingly, the output voltage $V_3$ takes substantially the same value as the power voltage $V_D$ until the power voltage $V_D$ reaches the threshold voltage $V_{T8}$ of the transistor $Q_8$. The output voltage $V_3$ reaches the threshold voltage $V_{T9}$ (equal to $V_{T8}$) of the transistor $Q_9$ when the power voltage $V_D$ reaches the threshold voltage $V_{T8}$ of the transistor $Q_8$, and both of the transistors $Q_8$ and $Q_9$ start to become conductive. But in this instance, the conductance of the transistor $Q_7$ is still larger than that of the transistor $Q_8$, so that, with increasing $V_D$, the voltage $V_3$ continues to increase and exceeds the logic threshold voltage $V_{LOG}$ of the inverter ($Q_2$, $Q_9$). The node 2 thereby assumes a low level. The increase in the conductance of the transistor $Q_8$ is larger than that in the transistor $Q_7$, and when the conductance of the transistor $Q_8$ exceeds that of transistor $Q_7$, the output voltage $V_3$ starts to fall at a value $V_1$ of the voltage $V_D$. As the voltage $V_D$ further increases beyond the value $V_1$, the output voltage $V_3$ is decreased and takes a value equal to the threshold voltage $V_{T9}$ of the transistor $Q_9$ at a value $V_M$ of the voltage $V_D$. Since the threshold voltage $V_{T4}$ of the transistor $Q_4$ is equal to that of the transistor $Q_9$, when the power supply voltage $V_D$ increases to exceed $V_{T8}$, the transistor $Q_4$ begins to turn on at this time, since the transistor $Q_9$ also simultaneously begins to turn on, the potential at the output point 2 starts to fall more reliably than in the above-described memory circuit of the prior art. In the case of $V_D > V_M$, as the transistor $Q_9$ is held off, in the case where the flip-flop is to be set at the second stable state by means of the write transistor $Q_5$, the same operation as in the above-described memory circuit of the prior art is carried out. After the above-mentioned second stable state has been attained, when the power supply voltage $V_D$ has come within the range of $V_{T8} < V_D < V_M$, the transistor $Q_9$ is again turned on. In the range of $V_{T8} < V_D < V_M$, if the output voltage $V_3$ at the output point 3 exceeds a logic threshold voltage $V_{LOG}$ of the inverter consisting of the transistors $Q_2$ and $Q_9$, the potential at the output point 2 assumes a low level and the potential at the output terminal 1 assumes a high level, so that the illustrated memory circuit is again set at its initial state. The time required for the above-mentioned setting of the initial state is determined by the on-resistance $R_9$ of the transistor $Q_9$ and the node capacitance $C_2$. However, as the on-resistance $R_9$ is smaller than the leakage resistance $R_L$ in the case of the above-mentioned prior art circuit by a factor of a few decimal orders, the circuit can be set to the initial state very quickly.

Figure 4:
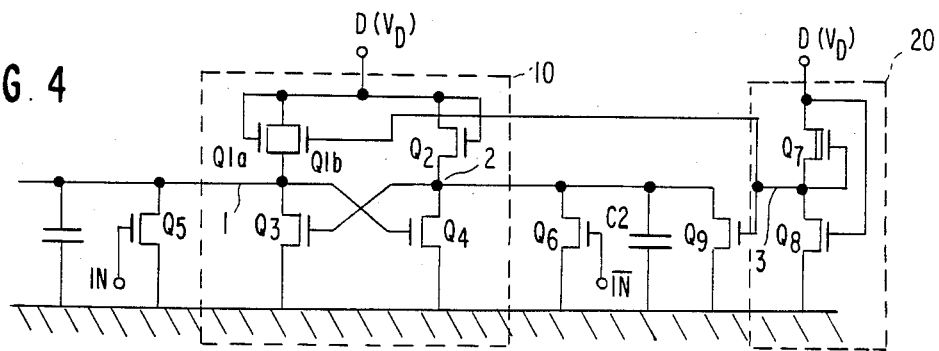
FIG. 4 is a circuit diagram showing a memory device according to another preferred embodiment of the present invention.

With reference to FIG. 4, another preferred embodiment of the present invention will be described.

In this embodiment, two enhancement type transistors $Q_{1a}$ and $Q_{1b}$ are used as a load connected beween a power supply terminal D and a node 1. The transistor $Q_{1a}$ has the same electrical characteristics as transistor $Q_2$. The transistor $Q_{1b}$ receives an output voltage $V_3$ of the detection circuit 20 at its gate. The remaining circuit structure is the same as that shown in FIG. 2. In this embodiment, the transistor $Q_{1b}$ assumes the conducting state simultaneously with the transistor $Q_9$ when the power supply voltage $V_D$ is at a value between $V_T$ and $V_m$ as shown in FIG. 3, and forcibly makes a potential at the node 1 assume high level. After the power supply voltage exceeds the value $V_m$ and the power supply voltage is set in its normal operation state, the transistor $Q_{1b}$ is held non-conducting. Accordingly, the transistor $Q_{1a}$ acts as a load of the flip-flop together with the transistor $Q_2$. Since the electrical characteristics of the transistor $Q_{1a}$ are substantially the same as those of the transistor $Q_2$, symmetry of the flip-flop 10 can be realized. Namely, the response of the flip-flop when it is changed from the set state to the reset state and vice-versa to a set state are made substantially the same. As a result, the memory of the present embodiment can achieve stable operation operation.

As described above, according to the present invention, reliable operation of the power-on-reset function which could not be achieved in the prior art can be realized.

In the above-described embodiment, the transistor $Q_2$ is not limited to the same enhancement type transistor as the transistors $Q_3$, $Q_4$, $Q_5$, etc. but it could be any enhancement type transistor having a threshold voltage $V_{TQ2}$ within the range of $0 \leq V_{TQ2} \leq V_T$. It is also obvious that the same effect can be achieved by making use of a depletion type transistor similar to the transistor $Q_1$ and having its source and gate connected in common.

In addition, the load transistors $Q_1$ and $Q_2$ could be transistors having the same threshold voltage, or the mutual conductance gm of the transistor $Q_1$ could be selected larger than that of the transistor $Q_2$.

I claim:

1. A memory device, comprising; first and second nodes, a power supply terminal, a reference voltage terminal, first load means coupled between said power supply terminal and said first node, second load means coupled between said power supply terminal and said second node, a first field effect transistor coupled between said first node and said reference voltage terminal and having a gate coupled to said second node, a second effect transistor coupled between said second node and said reference voltage terminal and having a gate coupled to said first node, a third field effect transistor coupled in parallel with said second field effect transistor, voltage detection means coupled to said power supply terminal and said reference voltage terminal for detecting when the potential at said power supply terminal assumes an intermediate value lower than a predetermined power supply value and means for rendering said third field effect transistor conductive when said detection means detects said intermediate value, whereby the electric charge at said second node is discharged by said third transistor when the potential of said power supply terminal is at said intermediate value.

2. The memory device according to claim 1, in which said detection means includes a series circuit including a plurality of field effect transistors coupled between said power supply terminal and said reference voltage terminal.

3. The memory circuit according to claim 1, in which said first load means includes a depletion type field effect transistor connected between said power supply terminal and said first node and having a gate connected to said first node.

4. The memory device according to claim 1, in which said first load means includes fourth and fifth field effect transistors coupled between said power supply terminal and said first node and said second load means includes a sixth field effect transistor coupled between said power supply terminal and said second node, said fourth and sixth transistors having gates coupled to said power supply terminal and having substantially the same electrical characteristics.

5. The memory device according to claim 4, further comprising means for rendering said fifth transistor conduct ve when said detection means detects said intermediate value.

6. A memory device, comprising; a flip-flop having first and second transistors whose gates and drains are cross-connected at first and second cross-connection points, and first and second load elements coupled between said first and second cross-connection points and a power supply terminal, respectively, a state setting transistor directly connected between said first cross-connection point and a reference potential point, means for generating a control voltage having a larger value than a threshold value of said state setting transistor when the voltage at said power supply terminal is an intermediate voltage which is larger than said reference potential and smaller than a predetermined power supply voltage, and means for applying said control voltage to the gate of said state setting transistor , whereby an electric charge at said first cross-connection point is discharged by said state setting transistor when said power supply terminal assumes said intermediate value.

7. The memory according to claim 6, in which a current feeding capability of said first load element is selected so as to be larger than that of said second load element.

8. A memory device, comprising; first and second nodes, a power supply terminal, a reference potential terminal, first and second field effect transistors having gates and drains cross-connected at said first and second nodes, respectively, a third field effect transistor of a depletion type having a gate and a source both connected to said first node and a drain connected to said power supply terminal, a fourth field effect transistor having a source connected to said second node and a drain and a gate both connected to said power supply terminal, a fifth field effect transistor connected between said second node and said reference potential terminal and having a gate connected to a third node, a sixth field effect transistor of a depletion type connected between said power supply terminal and said third node and having a gate connected to a source thereof, and a seventh field effect transistor connected between said third node and said reference potential terminal and having a gate connected to said power supply terminal.

9. A memory device, comprising; first and second nodes, a power supply terminal, a reference voltage terminal, first load means coupled between said power supply terminal and said first node, second load means coupled between said power supply terminal and said second node, a first field effect transistor coupled between said first node and said reference voltage terminal and having a gate coupled to said second node, a second field effect transistor coupled between said second node and said reference voltage terminal and having a gate coupled to said first node, a third field effect transistor coupled in parallel with said second transistor, voltage detection means coupled to said power supply terminal and said reference voltage terminal for detecting when a potential at said power supply terminal assumes an intermediate value lower than a predetermined power means for rendering said third field effect transistor conductive when said detection means detects said intermediate value, and means for operatively increasing the current feeding ability of said first load means when said detection means detects said intermediate value.

10. The memory device according to claim 9, in which said first load means includes third and fourth field effect transistors coupled between said power supply terminal and said first node and said second load means includes a fifth field effect transistor coupled between said power supply terminal and said second node, said third and fifth transistors having gates coupled to said power supply terminal and having substantially the same electrical characteristics.

11. The memory device according to claim 9, in which said detection means includes a series circuit including a plurality of field effect transistors coupled between said power supply terminal and said reference voltage terminal.

12. A memory device, comprising; first and second nodes, a power supply terminal for energization with a predetermined power supply voltage, a reference voltage terminal, first load means coupled between said power supply terminal and said first node, second load means coupled between said power supply terminal and said second node, a first field effect transistor coupled between said first node and said reference voltage terminal and having a gate coupled to said second node, a second field effect transistor coupled between said second node and said reference voltage terminal and having a gate coupled to said first node, a third field effect transistor coupled between said second node and said reference voltage terminal, voltage detection means responsive to a voltage at said power supply terminal for detecting when the voltage at said power supply terminal is within a range between a first level and a second level, each of which is smaller in absolute value than said predetermined power supply voltage, to produce a detection signal, and means responsive to said detection signal for operatively making said third field effect transistor conductive.

13. A memory device according to claim 12, in which said detection means includes a series circuit including a fourth field effect transistor of a depletion type and a fifth field effect transistor coupled between said supply terminal and said reference voltage terminal, with a gate of the fifth transistor connected to the power supply terminal.

14. A memory circuit according to claim 12 or 13, in which said first load means includes a depletion type field effect transistor connected between said power supply terminal and said first node and having a gate connected to said first node.

15. A memory device according to claim 12 or 13, in which said first load means includes fourth and fifth field effect transistors coupled between said power supply terminal and said first node and said second load means includes a sixth field effect transistor coupled between said power supply terminal and said second node, said fourth and sixth transistors having gates coupled to said power supply terminal and having substantially the same electrical characteristics, and further comprising means responsive to said detection signal for making said fifth transistor conductive.

16. A memory device according to claim 12 or 13, in which the current feeding ability of the first load means exceeds that of the second load means.

17. A memory device, comprising; a flip-flop having first and second cross-connection points, a state setting transistor connected between said first cross-connection point and a reference potential point, a power supply terminal for energization with a predetermined power supply voltage, means for generating a control voltage capable of making said state setting transistor conductive when the absolute value of the voltage at said power supply terminal is larger than said reference potential and smaller than said predetermined power supply voltage, and means for applying said control voltage to the gate of said state setting transistor, said state setting transistor being held in an off state when said control voltage is not generated.

18. A memory according to claim 17, in which the current feeding capability of a first load connected to said first cross-connection point in said flip-flop is selected larger than a current feeding capability of a second load connected to said second cross-connection point.

* * * * *

UNITED STATES PATENT AND TRADEMARK OFFICE
CERTIFICATE OF CORRECTION

PATENT NO. : 4,594,688
DATED : June 10, 1986
INVENTOR(S) : TAKASHI UNO

It is certified that error appears in the above-identified patent and that said Letters Patent is hereby corrected as shown below:

Column 1, Line 35 is not a new paragraph

Column 1, Line 51 after "a" and before "in" insert --shortcoming--

Column 3, Line 52 delete "$Q_1$ and $Q_2$" and insert --$C_1$ and $C_2$--

Column 6, Line 18 delete "beween" and insert --between--

Column 6, Line 38 delete "to a set state"

Column 6 Line 40 delete in the second occurrence "operation"

Column 7, Claim 5, Line 3 after "conduct" and before "ve" insert --i--

Signed and Sealed this

Twenty-fourth Day of March, 1987

*Attest:*

DONALD J. QUIGG

*Attesting Officer*     *Commissioner of Patents and Trademarks*